US012801010B2

(12) United States Patent
Hong et al.

(10) Patent No.: US 12,801,010 B2
(45) Date of Patent: Nov. 17, 2026

(54) PELLICLE FOR EUV LITHOGRAPHY

(71) Applicant: S&S TECH Co., Ltd., Daegu (KR)

(72) Inventors: Ju-Hee Hong, Daegu (KR); Chul-Kyun Park, Daegu (KR); Mun-Su Choi, Daegu (KR); Dong-Hoi Kim, Daegu (KR)

(73) Assignee: S&S TECH Co., Ltd., Daegu (KR)

( * ) Notice: Subject to any disclaimer, the term of this patent is extended or adjusted under 35 U.S.C. 154(b) by 562 days.

(21) Appl. No.: 18/358,561

(22) Filed: Jul. 25, 2023

(65) Prior Publication Data

US 2024/0036461 A1 Feb. 1, 2024

(30) Foreign Application Priority Data

Jul. 28, 2022 (KR) ........................ 10-2022-0093912
May 4, 2023 (KR) ........................ 10-2023-0058646

(51) Int. Cl.
*G03F 1/62* (2012.01)

(52) U.S. Cl.
CPC ..................................... *G03F 1/62* (2013.01)

(58) Field of Classification Search
CPC ........................................................ G03F 1/62
See application file for complete search history.

(56) References Cited

U.S. PATENT DOCUMENTS

| | | | |
|---|---|---|---|
| 10,274,820 B2 | 4/2019 | Jeon et al. | |
| 2016/0334698 A1 | 11/2016 | Jeon et al. | |
| 2017/0184957 A1 | 6/2017 | Kohmura et al. | |
| 2019/0129299 A1 | 5/2019 | Nasalevich et al. | |
| 2019/0146324 A1 | 5/2019 | Nam et al. | |
| 2019/0146332 A1 | 5/2019 | Van Zwol et al. | |
| 2019/0384163 A1 | 12/2019 | Kim et al. | |
| 2021/0096458 A1* | 4/2021 | Nam | G03F 1/62 |
| 2022/0043336 A1 | 2/2022 | Shin et al. | |
| 2022/0146949 A1 | 5/2022 | Kim et al. | |

FOREIGN PATENT DOCUMENTS

| | | | |
|---|---|---|---|
| CN | 110609435 | A | 12/2019 |
| EP | 3483656 | A1 | 5/2019 |
| KR | 1020170085161 | A | 7/2017 |
| KR | 101900720 | B1 | 9/2018 |
| KR | 1020200141913 | A | 12/2020 |
| KR | 102366806 | B1 | 2/2022 |
| KR | 1020220017132 | A | 2/2022 |
| KR | 1020220017133 | A | 2/2022 |
| KR | 102375433 | B1 | 3/2022 |
| KR | 1020220063124 | A | 5/2022 |
| TW | 202121052 | A | 6/2021 |
| TW | 202201145 | A | 1/2022 |
| TW | 202206269 | A | 2/2022 |
| WO | 2019091932 | A1 | 5/2019 |
| WO | 2021080294 | A1 | 4/2021 |

* cited by examiner

*Primary Examiner* — Stewart A Fraser
(74) *Attorney, Agent, or Firm* — WILLIAM PARK AND ASSOCIATES LTD.

(57) ABSTRACT

The pellicle has a pellicle portion that allows transmission of EUV exposure light. The pellicle portion comprises a heat radiation layer for radiating heat generated by irradiation of EUV exposure light. The heat radiation layer comprises metal and silicon, and the metal content of the heat radiation layer is greater than the silicon content. This ensures a high transmittance of 90% or more, while improving the heat radiation performance of the pellicle portion, so that it can be applied to EUV exposure light powers of 600 W or more.

8 Claims, 3 Drawing Sheets

PELLICLE FOR EUV LITHOGRAPHY

CROSS-REFERENCE TO RELATED THE APPLICATION

This application is based on and claims priority under 35 U.S.C. § 119(a) to Korean Patent Applications No. 10-2022-0093912 filed on Jul. 28, 2022, and No. 10-2023-0058646 filed on May 4, 2023, in the Korean Intellectual Property Office, the disclosure of which is incorporated by reference herein in its entirety.

BACKGROUND

Field

The present invention relates to a pellicle, and more particularly, to an extreme ultraviolet lithography pellicle mounted on an EUV photomask used in EUV lithography.

Description of the Related Art

EUV lithography is a technology that uses extreme ultraviolet (EUV) light with a wavelength of 13.5 nanometers to create fine patterns. In the lithography process, a photomask is used as a master pattern for patterning. If particles or other impurities are attached to the photomask, the EUV light may be absorbed or reflected, which can damage the transferred pattern. This can lead to a decrease in the performance or yield of the semiconductor device. Therefore, a pellicle is used to prevent impurities from attaching to the photomask surface.

A pellicle is placed on the top of the photomask surface. Even if impurities attach to the pellicle, the focus of the EUV light is on the photomask pattern, so the impurities will not be transferred to the wafer surface. Recently, the size of impurities that can damage patterns has decreased due to the miniaturization of circuit line widths. Therefore, the role of the pellicle in protecting the photomask has become even more important.

Typically, a pellicle has a core layer that provides EUV light transmittance and a capping layer that protects the core layer. The core layer is made of a material that includes metal and silicon, and the capping layer is made of a material that does not react with hydrogen radicals to prevent the core layer from being damaged by hydrogen radicals in the lithography system.

However, these pellicles are exposed to EUV light during the lithography process, which generates heat in the film. The heat can reduce the mechanical strength of the pellicle and cause the film to break. Therefore, it is necessary to find a way to effectively dissipate the heat from the film. In general, 250 W of EUV light power has been used in EUV lithography processes, but recently, the power of EUV light has been increased to over 600 W to improve the productivity of the lithography process. As a result, the improvement of the heat dissipation performance of pellicles has become an increasingly important issue.

SUMMARY

The present invention provides an extreme ultraviolet (EUV) lithography pellicle having an improved thermal radiation performance while securing the required optical transmittance.

To achieve the above purpose, the present invention provides an EUV lithography pellicle having a pellicle portion that allows transmission of EUV exposure light, the pellicle portion comprising a heat radiation layer for radiating heat generated by irradiation of EUV exposure light, wherein the heat radiation layer comprises metal and silicon, and the heat radiation layer has a content of the metal greater than a content of the silicon.

The thermal radiation layer has a composition ratio of metal:silicon=1:0.6~0.99 (at %).

The metal in the thermal radiation layer comprises at least one of molybdenum (Mo), vanadium (V), palladium (Pd), titanium (Ti), platinum (Pt), cadmium (Cd), zirconium (Zr), lithium (Li), selenium (Se), yttrium (Y), beryllium (Be), hafnium (Hf), niobium (Nb), ruthenium (Ru), lanthanum (La), and cerium (Ce).

The thermal radiation layer may further comprise at least one of boron (B), carbon (C), oxygen (O), and nitrogen (N).

The pellicle portion may further comprise at least one capping layer for preventing a hydrogen radical reaction of the pellicle portion, and an auxiliary layer for preventing diffusion between the capping layer and the thermal radiation layer, which is arranged between the thermal radiation layer and the capping layer.

The capping layer comprises at least one of silicon (Si), boron (B), zirconium (Zr), zinc (Zn), and molybdenum (Mo), and at least one of carbon (C), nitrogen (N), and oxygen (O).

The auxiliary layer comprises at least one of BC, BN, BNC, SiB, SiC, SiO, SiN, ACL (Amorphour Carbon:amorphous carbon), B-ACL, and MeSi (Me is metal), and at least one of carbon (C), nitrogen (N), and oxygen (O).

In an embodiment of the present invention, a plurality of thermal radiation layers and a plurality of auxiliary layers may be alternately stacked.

Preferably, two thermal radiation layers and three auxiliary layers are alternately stacked.

The pellicle portion has a thickness of 30 nm or less.

The thermal radiation layer has a thickness of 15 nm or less.

The auxiliary layer has a thickness of 3 nm or less.

The capping layer has a thickness of 5 nm or less.

The pellicle portion has a transmittance of 90% or more for the exposure light.

According to the present invention, the thermal radiation layer that functions as the core layer comprises silicon and metal, and the metal content of the thermal radiation layer is higher than the silicon content. This improves the thermal radiation performance of the pellicle portion while securing a high transmittance of 90% or more, and can be applied to EUV exposure light power of 600 W or more.

DETAILED DESCRIPTION OF EXEMPLARY EMBODIMENTS

The following will describe the invention in detail, referring to the attached drawings.

Figure 1:
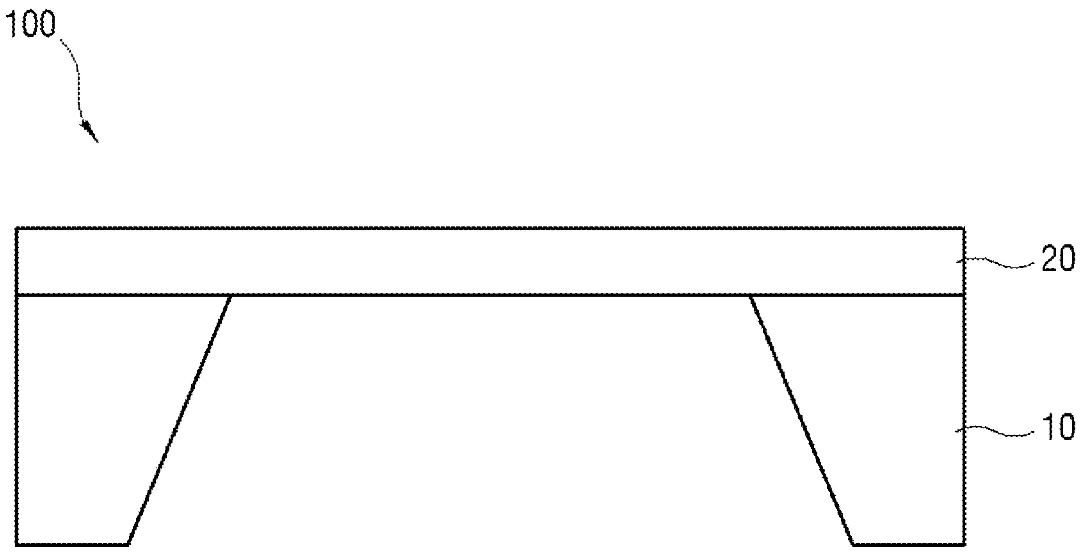
FIG. 1 is a schematic diagram of the basic structure of the pellicle for extreme ultraviolet lithography according to the present invention.

FIG. 1 is a schematic diagram of the basic structure of the pellicle for extreme ultraviolet lithography according to the present invention. The pellicle 100 comprises a pellicle portion 20 and a support portion 10.

The pellicle portion 20 has the function of transmitting extreme ultraviolet exposure light with a wavelength of 13.5 nm. The pellicle portion 10 of the present invention has a transmittance of 90% or more for EUV exposure light.

The support portion 10 supports the pellicle portion 20. The support portion 10 is obtained by etching a transparent substrate.

Figure 2:
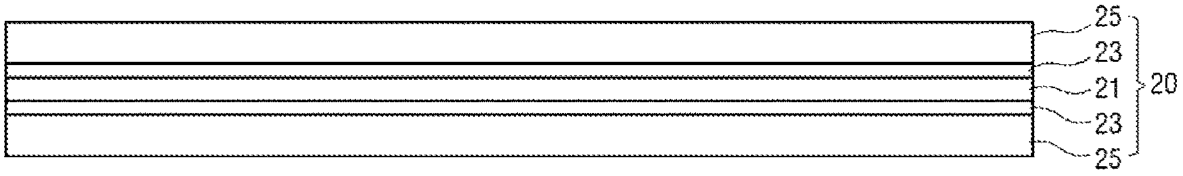
FIG. 2 is a diagram showing the first embodiment of the pellicle portion in FIG. 1.

FIG. 2 is a diagram of the first embodiment of the pellicle portion of FIG. 1.

The pellicle portion 20 comprises a heat radiation layer 21, an auxiliary layer 23, and a capping layer 25.

The heat radiation layer 21 has the function of transmitting extreme ultraviolet exposure light with a wavelength of 13.5 nm without damaging the transmittance. In addition, the heat radiation layer 21 has the function of radiating heat generated by irradiation of extreme ultraviolet exposure light. The heat radiation layer 21 can be composed of one layer or two or more layers.

The heat radiation layer 21 comprises a metal and silicon. The metal comprises at least one of molybdenum (Mo), vanadium (V), palladium (Pd), titanium (Ti), platinum (Pt), cadmium (Cd), zirconium (Zr), lithium (Li), selenium (Se), yttrium (Y), beryllium (Be), hafnium (Hf), niobium (Nb), ruthenium (Ru), lanthanum (La), and cerium (Ce). Preferably, the metal is composed of molybdenum (Mo). The heat radiation layer 21 may further comprise at least one of boron (B), carbon (C), oxygen (O), and nitrogen (N).

The heat radiation layer 21 preferably has a thickness as thin as possible in order to secure a maximum transmittance, especially 90% or more. To this end, the heat radiation layer 21 has a thickness of 15 nm or less, and preferably has a thickness of 10 nm or less.

The capping layer 25 is arranged at the outermost side of the pellicle portion 20. Preferably, as shown in FIG. 2, the capping layers 25 are arranged at the bottom and the top of the pellicle portion 20. The exposure apparatus in which the pellicle 100 is used contains a large amount of hydrogen radicals, and these hydrogen radicals react with the pellicle portion 20 and cause damage to the pellicle portion 20. The capping layer 25 has the function of protecting the pellicle portion 20 by preventing hydrogen radical reaction.

The capping layer 25 comprises at least one of silicon (Si), boron (B), zirconium (Zr), zinc (Zn), and molybdenum (Mo). The capping layer 25 may further comprise at least one of carbon (C), nitrogen (N), and oxygen (O). Preferably, the capping layer 25 is formed of SiC.

The capping layer 25 preferably has a thickness as thin as possible in order to prevent a decrease in transmittance due to an increase in thickness while having the function of suppressing hydrogen radical reaction. To this end, each capping layer 25 has a thickness of 5 nm or less.

The auxiliary layer 23 is arranged between the heat radiation layer 21 and the capping layer 25 and plays a role in complementing the thermal characteristics between the capping layer 25 and the heat radiation layer 21. As shown in FIG. 2, if a pair of capping layers 25 are formed, a pair of auxiliary layers 23 are also formed. If the heat radiation layer 21 and the capping layer 25 are contacted directly to each other, thermal problems such as thermal expansion and diffusion may occur between the heat radiation layer 21 and the capping layer 25. Thermal problems can also occur during the process of forming the capping layer 25 on the heat radiation layer 21, or during the use of the pellicle 100 by the energy of irradiation of extreme ultraviolet exposure light. The auxiliary layer 23 prevents thermal problems that occur in such situations. The auxiliary layer 23 also has the function of complementing the mechanical strength of the pellicle portion 20.

The auxiliary layer 23 comprises at least one of BC, BN, BNC, SiB, SiC, SiO, SiN, ACL (Amorphous Carbon Layer), B-ACL, and MeSi. Here, ACL means a material that has amorphous carbon as the basic material. B-ACL is a material that contains boron (B) as an additive material in ACL, more specifically, a compound in which B is chemically bonded with ACL. B-ACL includes cases where some of the constituent elements of ACL are bonded with B. When boron (B) is added to ACL, the transmittance of the film is improved and the strength is increased, but the thermal stability is lowered as the B content increases. In particular, B-ACL has a higher modulus, that is, the elasticity, than ACL, and thus provides more resistance to tearing. On the other hand, as the carbon (C) content in B-ACL increases, the thermal stability increases. Therefore, the B/C ratio can be appropriately selected considering the transmittance, strength, and thermal stability required for the pellicle. Preferably, B-ACL is composed to have a ratio of B:C=1 at %:0.5 to 15 at %. Within this range of ratio, the effect of adding B is exerted while the deterioration of thermal stability due to excessive decrease in the C content does not occur. Further, "Me" is used as a general term for metal materials. For example, Me can be a material that contains at least one of molybdenum (Mo), vanadium (V), palladium (Pd), titanium (Ti), platinum (Pt), cadmium (Cd), zirconium (Zr), lithium (Li), selenium (Se), yttrium (Y), beryllium (Be), hafnium (Hf), niobium (Nb), ruthenium (Ru), lanthanum (La), and cerium (Ce).

The auxiliary layer 23 may further comprise at least one of carbon (C), nitrogen (N), and oxygen (O). If these light elements are further included, it is preferable that their contents are smaller than the contents of other materials, and it is more preferable to have an atomic ratio of not more than 30 at %.

It is preferable that the auxiliary layer 23 has a thickness as thin as possible in order to prevent a decrease in transmittance due to an increase in thickness while solving thermal problems. To this end, the auxiliary layer 23 has a thickness of 3 nm or less.

The pellicle 20 has a thickness of 30 nm or less to increase the transmittance of EUV exposure light. To further increase the transmittance, the pellicle 20 of the present invention has a thickness of 25 nm or less, preferably 20 nm or less. The pellicle 20 of the present invention has a transmittance of 90% or more for EUV exposure light with a wavelength of 13.5 nm.

If the heat radiation layer 21 that functions as the central layer is composed of MoSi, in the conventional art, the Si content has been twice as much as Mo. The heat radiation layer 21 with a ratio of metal:silicon=1:2 (at %) has shown a heat radiation performance that can be applied when the power of the EUV exposure light is 250 W. However, if the power of the EUV exposure light is increased from this, for example, to 600 W or more, a higher heat radiation performance is required, and the heat radiation layer 21 with a ratio of metal:silicon=1:2 does not meet these requirements.

In the past, research to improve heat radiation performance has been conducted in a manner of changing the composition itself, such as adding additional materials other than metal or combining two or more different metals. However, the inventors of the present invention found that the heat radiation performance of the heat radiation layer 21 composed of a thin film of nano-scale thickness can be improved by adjusting the ratio of metal to silicon. The heat radiation layer 21 of the present invention has a characteristic of having a higher metal content than silicon content. Here, the content refers to the content based on at %. Compared to the configuration in which the silicon content is twice as much as metal in the past, the heat radiation performance was improved when the metal content was made to be higher than the silicon content as in the present invention.

Specifically, the heat radiation layer 21 has a composition ratio of metal:silicon=1:0.6-0.9 (at %). If the silicon content is less than this range, the transmittance of the heat radiation layer 21 is reduced, so it is difficult to secure a transmittance of 90% or more of the pellicle portion 20, so the thickness of the heat radiation layer 21 must be 10 nm or less to secure the transmittance. However, such a very thin film heat radiation layer 21 is very difficult to manufacture and it is difficult to secure mechanical strength. Also, if the silicon content is larger than this range, the improvement degree of heat radiation performance may be insufficient.

Figure 3:
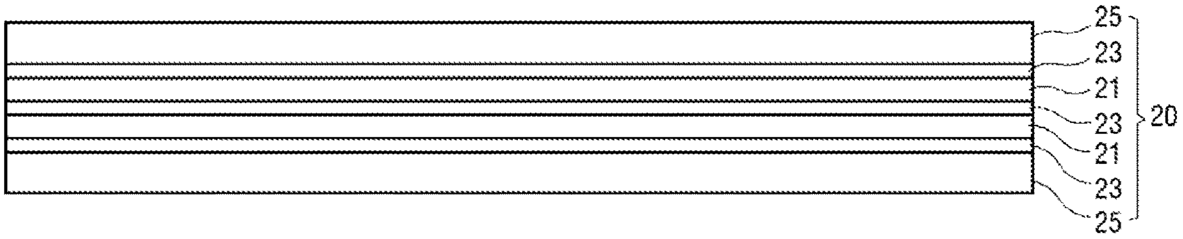
FIG. 3 is a diagram showing the second embodiment of the pellicle portion in FIG. 1.

FIG. 3 is a diagram showing the second embodiment of the pellicle portion of FIG. 1.

The pellicle portion 20 of the present invention can have a structure in which a plurality of heat radiation layers 21 and a plurality of auxiliary layers 23 are alternately stacked. The capping layers 25 are arranged at the outermost sides of the pellicle portion 20. In the embodiment of FIG. 3, the pellicle portion 20 has a structure with two heat radiation layers 21 and three auxiliary layers 23, and is composed of a total of seven layers including the upper and lower capping layers 25. In this way, if there are two heat radiation layers 21, the heat radiation performance is further improved. The number of heat radiation layers 21 can three or more. In this case, it is preferable to form each of the heat radiation layers 21 to have a thickness as thin as possible in order to prevent excessive increase in the thickness of the entire pellicle portion 20.

Although details of the disclosure have been described above through a few embodiments of the disclosure with reference to the accompanying drawings, the embodiments are merely for the illustrative and descriptive purposes only but not construed as limiting the scope of the disclosure defined in the appended claims. It will be understood by a person having ordinary skill in the art that various changes and other equivalent embodiments may be made from these embodiments. Thus, the scope of the invention should be defined by the technical subject matters of the appended claims.

What is claimed is:

1. An EUV lithography pellicle having a pellicle portion that allows transmission of EUV exposure light, the pellicle portion comprising:

a heat radiation layer for radiating heat generated by irradiation of EUV exposure light;

one or more capping layers arranged at the outermost side of the pellicle portion to prevent hydrogen radical reaction of the pellicle portion; and an auxiliary layer arranged between the heat radiation layer and the capping layer to prevent diffusion between the capping layer and the heat radiation layer, wherein the heat radiation layer comprises metal and silicon, wherein the heat radiation layer has a composition ratio of metal: silicon=1:0.6 to 0.99 (at %), wherein the heat radiation layer has a thickness of 15 nm or less, wherein the auxiliary layer has a thickness of 3 nm or less, wherein the capping layer has a thickness of 5 nm or less, and wherein the pellicle portion has a thickness of 30 nm or less.

2. The EUV lithography pellicle of claim 1, the metal of the heat radiation layer comprises at least one of molybdenum (Mo), vanadium (V), palladium (Pd), titanium (Ti), platinum (Pt), cadmium (Cd), zirconium (Zr), lithium (Li), selenium (Se), yttrium (Y), beryllium (Be), hafnium (Hf), niobium (Nb), ruthenium (Ru), lanthanum (La), and cerium (Ce).

3. The EUV lithography pellicle of claim 2, the heat radiation layer further comprises at least one of boron (B), carbon (C), oxygen (O), and nitrogen (N).

4. The EUV lithography pellicle of claim 1, wherein the capping layer comprises at least one of silicon (Si), boron (B), zirconium (Zr), zinc (Zn), and molybdenum (Mo), and further comprises at least one of carbon (C), nitrogen (N), and oxygen (O).

5. The EUV lithography pellicle of claim 4, wherein the auxiliary layer comprises at least one of BC, BN, BNC, SiB, SiC, SiO, SIN, ACL (amorphous carbon), B-ACL, and MeSi (Me is a metal), and further comprises at least one of carbon (C), nitrogen (N), and oxygen (O).

6. The EUV lithography pellicle of claim 1, wherein the pellicle portion comprises a plurality of heat radiation layers and a plurality of auxiliary layers that are alternately stacked.

7. The EUV lithography pellicle of claim 6, wherein the pellicle portion comprises two heat radiation layers and three auxiliary layers that are alternately stacked.

8. The EUV lithography pellicle of claim 1, wherein the pellicle portion has a transmittance of 90% or more for the exposure light.

* * * * *